United States Patent [19]

Seward

[11] 4,112,395

[45] Sep. 5, 1978

[54] METHOD OF AND APPARATUS FOR MATCHING A LOAD CIRCUIT TO A DRIVE CIRCUIT

[75] Inventor: Glen Seward, Cincinnati, Ohio

[73] Assignee: Cincinnati Electronics Corp., Cincinnati, Ohio

[21] Appl. No.: 805,340

[22] Filed: Jun. 10, 1977

[51] Int. Cl.² .............................................. H03H 7/40
[52] U.S. Cl. .................................... 333/17 M; 333/32
[58] Field of Search ............... 333/17 M, 32; 325/174, 325/177

[56] References Cited

U.S. PATENT DOCUMENTS

| | | | |
|---|---|---|---|
| 3,475,703 | 10/1969 | Kennedy et al. | 333/17 M |
| 3,601,717 | 8/1971 | Kuecken | 333/17 M |
| 3,794,941 | 2/1974 | Templin | 333/17 M |

*Primary Examiner*—Paul L. Gensler
*Attorney, Agent, or Firm*—Lowe, King, Price & Markva

[57] ABSTRACT

A high Q load circuit is automatically matched to a drive circuit with an L network having a series reactance and a shunt reactance, one of which is on a load circuit side of the network and the other of which is on a drive circuit side of the network. The reactance on the load circuit side is of a type opposite to the reactance of the load, while the drive circuit reactance provides an approximate match between the drive and load circuits. Both reactances are varied until the voltage or current magnitude applied by the drive circuit to the network is at least equal to the voltage or current magnitude of the reactance on the input side. Then the reactances are varied until the voltage or current magnitude of the reactance on the input side is slightly less, by a predetermined amount, than the voltage or current of the reactance on the output side. For each unit change of the reactive value of the reactance on the load side, there is a small change in the reactive value of the reactance on the drive side.

21 Claims, 4 Drawing Figures

U.S. Patent  Sept. 5, 1978  4,112,395
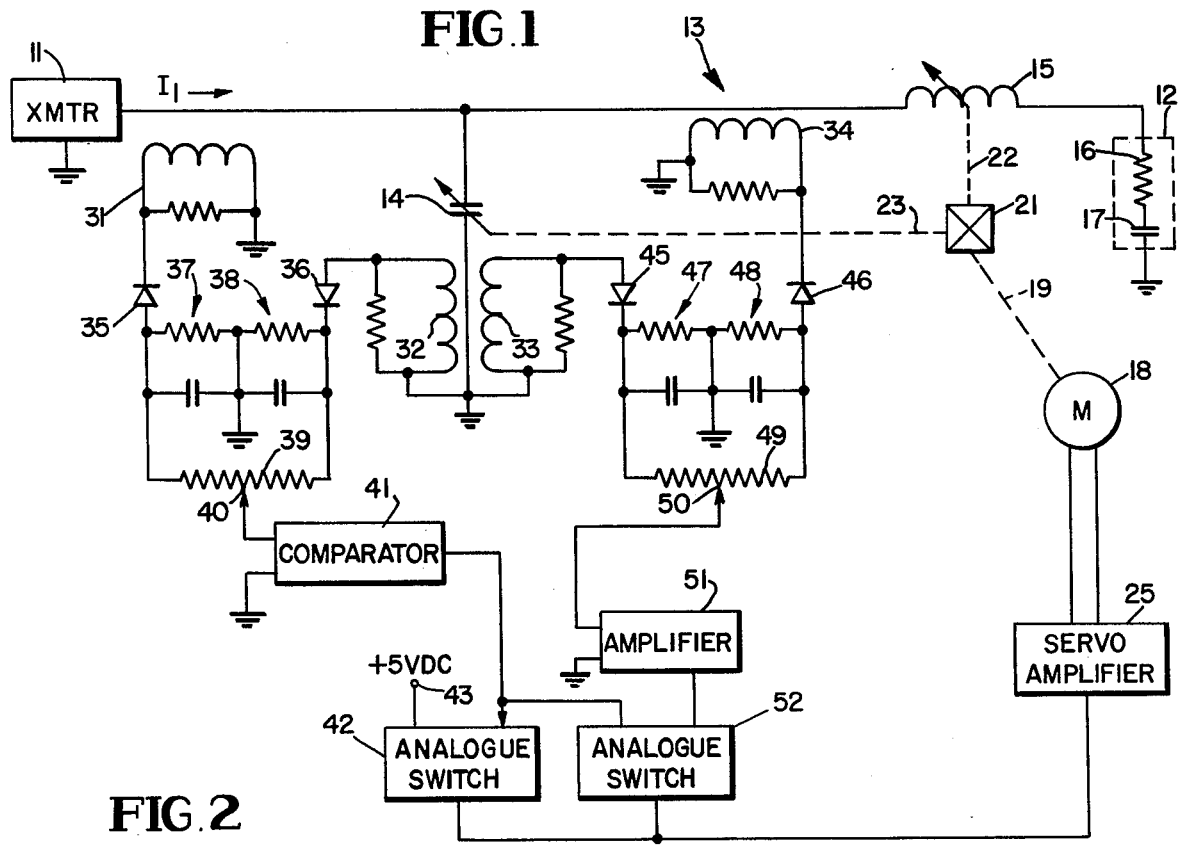
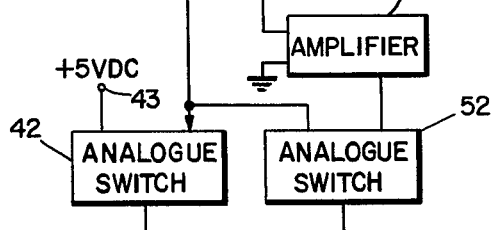
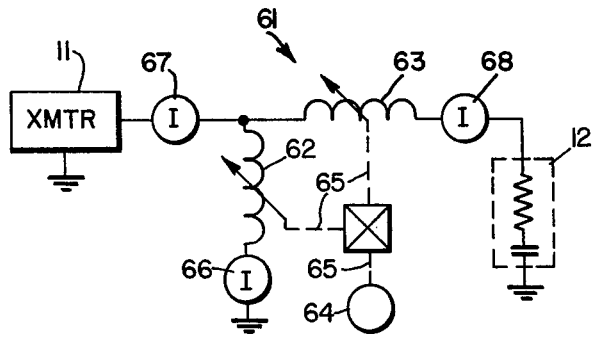
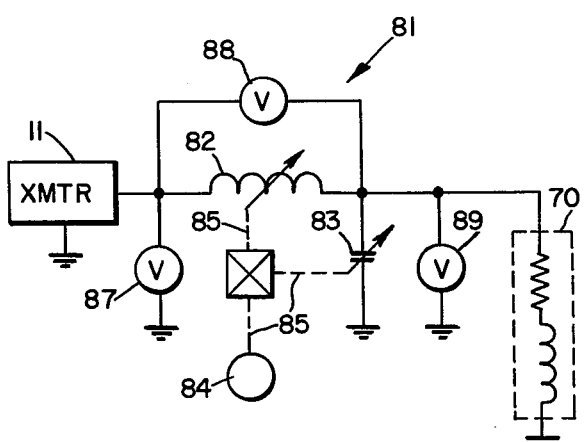
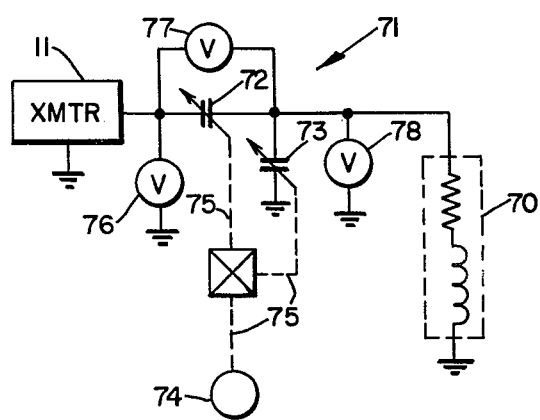

METHOD OF AND APPARATUS FOR MATCHING A LOAD CIRCUIT TO A DRIVE CIRCUIT

FIELD OF THE INVENTION

The present invention relates generally to an apparatus for and method of matching a load circuit to a drive circuit and more particularly to an apparatus for and method of matching, wherein a reactance on one side of an L network is varied in response to the current or voltage of the load and in a shunt arm of the network.

BACKGROUND OF THE INVENTION

For the past several years, the conventional approach for matching a high Q impedance (e.g., an antenna) to a real impedance (e.g., a transmitter) has utilized an L network with two independently controlled reactive matching elements in series and shunt arms of the network. Phase and impedance detectors control two separate closed loop servo systems. This approach is relatively expensive as it requires separate variable reactors with control and driving mechanisms for each, generally including a motor, tachometer-generator, servo amplifier, and gearing, or separate binary controllers for each reactor. Further, with many systems it is necessary to initialize the variable reactances of the network, which can cause complex and expensive hardware.

Examination of the values of a variable reactive element on the matched (e.g., transmitter) side of the L network indicates that it does not have to be adjusted very accurately if a variable reactive component on the unmatched load (e.g., antenna) side is carefully controlled. This property permits the matching element on the matched side to be preset either (1) as a function of frequency information, or (2) in unison with adjustment of the variable component on the load side of the network. Use of either of these techniques reduces the servo system complexity by nearly a factor of two, to provide a reduction in size and cost, while increasing reliability.

SUMMARY OF THE INVENTION

In accordance with the present invention, a load circuit is matched to a given real impedance of a driver with an L matching network including variable reactances in each of a series and shunt arm. In general, the reactance connected to the load is of a reactive type opposite from the reactance of the load. The reactance of the load, when combined with the reactance on the load side of the matching network, yields a combination near resonance when the circuit is in matched condition. If a reactance is in series with the load, the current in the load is compared with the current in the shunt arm on the driver side of the circuit to adjust the series arm reactance. If the reactance is in shunt with the load, the voltage across the reactance of the series arm is compared with the voltage across the load to adjust the shunt arm reactance.

This technique requires prior knowledge of the resistive component of the load for the current comparison technique, or of the conductance component of the load for the voltage comparison technique. With the invention, a VSWR of 2:1 is maintained even though the load resistive component or conductive component varies over a factor of four. The value of the variable reactance on the driver side is determined by the load resistance or conductance value. The component on the driver side need not be adjusted with great accuracy if the component on the load side is adjusted properly. This permits adjusting the two components of the L network simultaneously at different rates, while maintaining a good VSWR. For use with circuits where only limited tuning range is required, i.e. with transmitters having a relatively narrow output spectrum, the driver side reactance can be preset at a fixed value.

This invention offers control circuitry which requires no initial positioning of the variable components. If the shunt reactor is on the driver side of the circuit, the magnitude of the drive current is compared with the current in the shunt element. For an impedance match to be possible, it is necessary for the current in the shunt reactor to be greater than the drive current, a result achieved by presetting the shunt reactance, or by adjusting the shunt and series reactances in unison at a predetermined different ratio. Thereafter, the series reactance is adjusted, or both reactances are adjusted at the predetermined ratio, until the shunt current slightly exceeds the load current. In a similar manner, if the series reactor is on the drive side of the circuit, the voltage across this series reactor must be greater than the voltage of the drive circuit, a result achieved by presetting the series reactance or by adjusting the series and shunt reactances in unison at a predetermined ratio. Thereafter, the series reactance is adjusted or both reactances are adjusted until the shunt current slightly exceeds the load current.

The frequency range over which this invention functions properly is determined by whether the proper adjustment of the reactances can be maintained. A short antenna has been matched over a 24 to 76 mHz frequency range using the invention.

OBJECTS OF THE INVENTION

It is, accordingly, an object of the present invention to provide a new and improved apparatus for and method of matching a drive circuit to a load circuit.

Another object of the invention is to provide a new and improved apparatus for and method of matching a drive circuit to a load circuit, wherein one of the circuits has a high Q.

Another object of the invention is to provide a new and improved apparatus for and method of matching a drive circuit to a load circuit with an L network including series and shunt reactances that are varied with a single controller.

A further object of the invention is to provide a new and improved apparatus for and method of simultaneously adjusting reactances of an L matching network.

Still another object of the invention is to provide a relatively simple and inexpensive network for automatically matching a load circuit to a drive circuit, wherein one of the circuits has a relatively high Q.

Yet another object of the invention is to provide a new and improved apparatus for and method of matching a drive circuit to a load circuit, wherein one of the circuits has a high Q, and matching is attained within predetermined VSWR limits.

An additional object of the invention is to provide a new and improved method and apparatus for matching a load circuit to drive circuit wherein there is no need to establish initial conditions of reactances in the matching network.

Still a further object of the invention is to provide a new and improved method of and apparatus for matching drive and load circuits within a predetermined VSWR range wherein only one reactance of a matching network need be varied, enabling the reactance to be implemented as a device controlled in binary increments.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIG. 1 is a block diagram of one embodiment of the present invention, and

FIGS. 2-4 are circuit diagrams of alternate embodiments of the matching network, particularly adapted to be utilized with different types of high Q loads.

DETAILED DESCRIPTION OF THE DRAWINGS

Reference is now made to FIG. 1 of the drawings wherein a drive circuit comprising transmitter 11 is connected to a high Q load circuit 12, such as an antenna, by an L-type matching network 13. The output impedance of the transmitter 11 is real and has the impedance of a transmission line (not shown) connecting it to the network 13. Network 13, transmitter 11, and load circuit 12 are capable of operating over a relatively wide bandwidth, such as the approximately one and onehalf octave range from 30 to 80 mHz. In the particular embodiment illustrated in FIG. 1, matching network 13 includes a shunt variable capacitor 14, connected between an output terminal of transmitter 11 and ground, as well as a series variable inductor 15, connected between the output terminal of transmitter 11 and load 12. Inductor 15 is utilized in the matching network 13 because it is known that load 12 is a high Q, primarily capacitive circuit including a resistance represented by resistor 16, and a capacitor represented by capacitor 17. Typically, the impedance seen by looking back into the output terminals of transmitter 11 is resistive and includes no substantial reactive component. However, it is to be understood that other types of matching networks and high Q inductive loads can be employed, as illustrated by FIGS. 2 through 4 which are discussed in greater detail infra.

Automatic matching between circuits 11 and 12 with network 13 is attained by simultaneously adjusting capacitor 14 and inductor 15 until the current supplied by transmitter 11 to network 13 is less than the current flowing in the shunt arm capacitor 14. This condition requires that the impedance of the series circuit including inductor 15 and load capacitor 17 be on the inductive side of resonance. After capacitor 14 and inductor 15 have been adjusted so the transmitter current is less than the shunt arm current, capacitor 14 and inductor 15 are varied simultaneously until the magnitude of the current flowing through capacitor 14 reaches a predetermined ratio, so that the magnitudes of the current flowing in inductor 15 and load 12 are about the same. The actual ratio of the currents flowing through capacitor 14 and inductor 15 is set by the potentiometer tap 50 so there is zero voltage on the tap when the current in load 12 is slightly greater, by a predetermined amount, than the current in capacitor 14; typically the ratio of the load current to the shunt arm current, (I12/I14) is 1.025 : 1. This corresponds to a total resistive component of about 3 ohms in load 12 and inductor 15 (when the loss reactance of the inductor is considered). This ratio varies slightly with the expected resistive components of the load and variable inductor. However, the load resistive component can vary from 1.5 to 6 ohms while the matching network maintains a 2:1 VSWR. For both sets of adjustments, for each unit change in the reactive value of inductor 15, there is a considerably greater change in the reactive value of capacitor 14, so that there is, in effect, a coarse adjustment of the capacitor and a fine adjustment of the inductor.

Apparatus for automatically controlling the values of capacitor 14 and inductor 15 in accordance with the just previously described method is illustrated in FIG. 1, wherein capacitor 14 and inductor 15 are simultaneously driven by bi-directional DC motor 18 that is responsive to feedback control signals derived from servo amplifier 25. Motor 18 includes an output shaft 19 that is connected by gear box 21 to capacitor 14 and inductor 15 by the respective output shafts 23 and 22. Gear box 21 is arranged so that there are many rotations of shaft 22 for each rotation of shaft 23. Thereby, there is a fine adjustment of inductor 15, and a coarse adjustment of capacitor 14; typically the gear ratio between shafts 22 and 23 is on the order of 18:1.

Control signals for servo amplifier 25 are derived by sensing the currents supplied by transmitter 11 to network 13, as well as the currents flowing in capacitor 14 and inductor 15 of network 13. To these ends, conventional ferrite core, current transformers 31-34 are provided; transformer 31 is lightly coupled to the rf input line, transformers 32 and 33 are lightly coupled to the shunt arm of network 13 including capacitor 14, and current transformer 34 is lightly coupled to the series arm of network 13 including inductor 15.

The magnitude of a voltage proportional to the output current of transmitter 11 is compared with the magnitude of the voltage proportional to the current in capacitor 14, by connecting oppositely polarized rectifying diodes 35 and 36 to transformers 31 and 32. Opposite electrodes of diodes 35 and 36 are respectively connected to filter networks 37 and 38 which are connected across opposite terminals of potentiometer 39. Potentiometer 39 includes a tap 40, connected to one input of analog comparator 41, an operational amplifier in one embodiment. The output of the comparator 41 drives two analog switches 42 and 52 in parallel. Comparator 41 turns on analog switch 42 if the input current from transmitter 11 is greater than the current in the variable capacitor 14. Analog switch 52 is off when the above condition exists. When switch 42 is turned on, a positive DC voltage at terminal 43 is applied through the switch to the servo amplifier 25 which drives motor 18 so the motor runs in the direction which increases the values of variable inductance 15 and variable capacitance 14. The voltage at terminal 43 can be derived from the system power supply since the voltage is supplied to amplifier 25 only when the current from transmitter 11 is greater than that through variable capacitor 14.

When the magnitude of the input current from transmitter 11 is less than the magnitude of the variable capacitor 14 current, switch 42 is turned off and switch 52 is turned on. With switch 52 on, amplifier 25 is responsive to an error signal indicating the deviation of the currents in capacitor 14 and load 12 from the 1.025 : 1 ratio. The error signal is derived by respectively connecting windings 33 and 34 to oppositely polarized diodes 45 and 46 that are connected to ground through filters 47 and 48. The opposite polarity DC voltages across filters 47 and 48 are algebraically subtracted in potentiometer 49, having a tap 50 that is connected to the input of DC amplifier 51. Amplifier 51 derives a proportional error which drives servo amplifier 25 via analog switch 52. Zero output from tap 50 and amplifier 51 occurs when the voltage proportional to the current in the inductor 15 is about 1.025 times as great as the magnitude of the current in the variable capacitor 14. This corresponds to the match point and motor 18 receives no signal at this point. However, if the current in the inductor 15 is less than 1.025 times the current in the variable capacitor 14, motor 18 drives capacitor 14 and inductor 15 in the direction to increase the variable inductor 15 reactance and variable capacitor reactance 14. Conversely, if the current in the inductor 15 is more than 1.025 times greater than the current in the capacitor 14, the capacitor reactance and inductor reactance are reduced in value. It is to be noted that a necessary condition is that the input current is less than the current through the variable capacitor 14 for the above condition to apply. This condition eliminates the requirement to preset initial conditions.

The analog switches 42 and 52 are simple devices known to those familiar with the art. For example, either field effect transistor switches or relays can be effectively used. This does not preclude other switching devices which can be used in this application.

Further examination of the control technique described herein indicates that it can be extended to binary tuning of the network. Binary relationship of variable components means that the variable components are so arranged that in the case of the variable inductor 15, with a maximum inductance L, the largest inductance is L/2, the second largest is L/4, the third largest is L/8, etc., to the minimum resolution required. The variable capacitors are related in the same manner as described for the variable inductor.

For binary control, the fact that the variable component on the transmitter side does not have to be set accurately is used. In this case, the variable capacitor 14 is set based on the predetermined knowledge of the resistive component of load 12 plus the resistive component of the variable inductor 14. This can be set based on frequency information. The variable inductor 15 is then varied by first adjusting the value to L/2, and then determining whether L/2 for inductor 15 is too large or too small. If L/2 is too large the current through inductor 15 is too large; i.e., if I15 is greater than 1.025 I14, L/2 is replaced by L/4. If L/2 is too small a value for inductor 15, L/2 remains in the circuit and L/4 is added so that the value of the inductor becomes 3L/4. This process is repeated until the best combination of inductors is used and a match is attained.

For the binary control, amplifier 51 is replaced by a comparator, which can be a saturating operational amplifier. Both comparator 41 and amplifier 51 have a logic, binary output, (in the binary control embodiment) enabling variable inductor 15 to be controlled by conventional logic circuitry. For example, anytime the current sensed by transformer 31 is greater than the current through capacitor 14, the inductor is increased in value, ignoring the output of amplifier 51. If the current through the capacitor 14 is greater than the current sensed by transformer 31, inductor 15 is controlled by amplifier 51 in response to the voltage at slider 50 being coupled through turned on switch 52. If, while switch 52 is on, the current in the inductor 15 is greater than 1.025 times the current in the capacitor, the inductor is increased in value. This process is repeated until the smallest step in the inductor has been tried. The impedance match then depends on the resolution of the smallest component of the inductor if the shunt capacitor is correct.

If the load impedance is not sufficiently well known as a function of frequency, which is not usually the case, the above process can be used for a first approximation. The impedance is then measured with a conventional impedance magnitude detector which calculates a ratio of rf voltage and rf current. If the detector is set for 50 ohms, the voltage-current ratio is one when matched. However, if the shunt component is incorrect, the impedance magnitude detector output produces a voltage ratio corresponding to the impedance magnitude. For example, a 25 ohm load would produce a detected voltage, proportional to rf current, that is twice the detected voltage which is proportional to rf voltage. This would indicate the shunt capacitor should be increased by the square root of two. If the shunt capacitor is controlled as a binary function, this change can be implemented by conventional logic circuitry. The process of selecting the correct inductance would be repeated until a satisfactory match is attained.

In FIGS. 2–4, variable reactances in different types of L networks are schematically illustrated as being driven in unison by a pair of shafts through gear trains which in turn are responsive to manual controllers, including knobs. In each instance, the reactance on the load side changes in value by a considerably greater amount than the change in value of the reactance on the drive (transmitter) side for each rotation of the knob. It is to be understood that automatic controllers are preferably employed to vary the values of the reactances of FIGS. 2–4 in accordance with the criteria set forth supra. Such controllers are similar to the controller described in connection with FIG. 1. Also, in FIGS. 2–4 ammeters and voltmeters are schematically illustrated as being connected in series and shunt with several of the components; it is to be understood that these meters are preferably conventional circuits for deriving DC control voltages representing the currents and voltages. The schematic showings in FIGS. 2–4, sans control circuitry, are made to expedite the presentation.

FIG. 2 incorporates a matching network 61 having a shunt, variable inductor 62 and a series, variable inductor 63. Inductors 62 and 63 are connected as an L network in a similar manner to the connections of capacitor 14 and inductor 15 in FIG. 1. L network 61 is driven by transmitter 11 and feeds high Q load 12, which is of the same type illustrated in FIG. 1 so that it includes a relatively large capacitive reactance and a relatively small resistance.

In the matching network of FIG. 2, the magnitude of the transmitter 11 current is determined by ammeter 67, the magnitude of the shunt inductor 62 current is determined by ammeter 66, and the magnitude of the series inductor 63 current is determined by ammeter 68. While meters 66–68 are schematically illustrated as conventional ammeters, it is to be understood that they are preferably lossely coupled transformers and rectifiers, as illustrated in FIG. 1. As in the circuit in FIG. 1, the magnitude of the current sensed by ammeter 66 must be greater than the current sensed by ammeter 67. If this is not the case, inductors 62 and 63 are decreased in value until the current sensed by ammeter 66 is greater than that sensed by ammeter 67. When the current sensed by ammeter 66 is at least equal to the current sensed by ammeter 67, variable inductors 62 and 63 are adjusted until the current sensed by ammeter 68 is 1.025 times the current sensed by ammeter 66. If the current in ammeter 68 is too large compared with the current in ammeter 66, variable inductors 62 and 63 are reduced in value in unison by turning knob 64 which drives shafts and a gear train 65. Again, the ratio of the currents sensed by meters 66 and 68 is controlled by the combined resistive components of load 12 and variable inductor 63. The combined resistive components of load 12 and inductor 63 must be determined for each system but is not very critical. Again, it is not necessary to establish initial conditions, but self-resonance of inductor 63 within the frequency band of transmitter 11 is to be avoided because self-resonance produces erroneous direction signals for controlling the variable inductor. This erroneous direction information, even if the inductor is beyond self-resonance, is not a condition for the circuit in FIG. 1.

If it is known that the load is primarily inductive rather than capacitive, as indicated by load circuit 70, FIG. 3, a matching network 71 including variable capacitors 72 and 73 is employed. Series capacitor 72 is connected between the output terminals of transmitter 11 and load 70. Capacitors 72 and 73 are simultaneously controlled by a single control, as indicated by knob 74 and shaft 75. Voltages are measured across the output terminals of transmitter 11 as well as the electrodes of capacitors 72 and 73 using voltmeters 76, 77 and 78. Meters 76-78 are schematically illustrated as voltmeters, although it is to be understood that conventional voltage measuring circuitry, of a type well known to those skilled in the art, can be employed.

The control in FIG. 3 is somewhat similar to those described for the circuits in FIGS. 1 and 2 except voltages are used for control instead of current. The coarse control requires the voltage indicated by voltmeter 77 to be greater than the voltage indicated on voltmeter 76. If this is not the case, variable capacitors 72 and 73 are reduced in capacity in unison, so that there is a considerably greater ratio of capacity change of capacitor 73 than the capacity change of capacitor 72 until this condition is met. Final tuning is accomplished by adjusting the variable capacitors until the voltages indicated by voltmeters 77 and 78 are nearly equal. The voltage read from meter 78 must be slightly greater than the voltage read on voltmeter 77. The desired ratio of the voltages read from meters 77 and 78 depends on the load conductance and can be controlled by means of a tapped potentiometer similar to that in FIG. 1. The conductance of capacitor 73 may also be included in designing the control scheme; but in general, the capacitor conductance is so small that it can usually be neglected.

This circuit offers the same advantages as that shown in FIG. 1 as no initial condition setting is required. Well behaved conductances permit the coupling of the capacitors via a gear train and permit single shaft tuning and offer a means of control which always drives the variable capacitors in the correct direction.

Transmitter 11 and load 70 can also be matched by utilizing network 81, as illustrated in FIG. 4. In network 81, a series variable inductor 82 is connected between the output terminals of transmitter 11 and load 70, and the variable capacitor 83 is connected in shunt with the load. The reactive values of inductor 82 and capacitor 83 are varied simultaneously in the same direction (i.e., increase the value of inductor 82 while decrease the value of capacitor 83 or vice versa) by a single controller indicated by knob 84, shafts 85 and gear train 86. The controlling parameters in the network of FIG. 4 are derived with voltmeters 87, 88 and 89. Meter 87 is connected across the output terminals of transmitter 11, while meter 89 is connected across capacitor 83 and load 70. The voltage across inductor 82 is monitored by meter 88.

Initially the voltages indicated by meters 87 and 88 are compared. If the voltage indicated by meter 87 is greater than the voltage indicated by meter 88, the reactive values of capacitor 83 and inductor 82 are increased by turning knob 84 until meter 88 indicates a greater voltage than meter 87. Then the reactive values of inductor 82 and capacitor 83 are varied by turning knob 84 until the voltages indicated by meters 88 and 89 are set so they are nearly equal. The desired ratio of the voltages indicated by meters 88 and 89 is determined by the load conductance.

Generalizing the operations of FIGS. 1-4 in generic terms, the first operation involves simultaneously increasing the reactive values of the reactances on the driver and load sides of the L network until a first parameter indicative of the output energy of the driver is less than a second parameter indicative of the energy in the reactance on the driver side. The first and second parameters are of the same type; in FIG. 1 the first and second parameters are respectively the output current of transmitter 11 and the current in capacitor 14; in FIG. 2, the first and second parameters are the currents respectively read from meters 67 and 66; in FIG. 3, the first and second parameters are the voltages respectively read from meters 76 and 77; and in FIG. 4, the first and second parameters are the voltages respectively read from meters 87 and 88. In certain instances, if transmitter 11 has a relatively narrow output spectrum, the first operation need not be performed so that the value of the reactance on the driver side can be initially preselected in a range to assure that the first parameter is less than the second parameter. Then, the reactances are adjusted until a third parameter, indicative of the load energy, is slightly more, by a predetermined amount, than the second parameter. The second and third parameters are of the same type; in FIG. 1, the third parameter is the rf load current, while in FIGS. 2-4, the third parameters are respectively derived from meters 68, 78 and 89. If the third parameter is less than the predetermined amount more than the second parameter, the reactive values of this reactance on the driver and load sides are increased in value; if the third parameter is greater than the second parameter by more than the predetermined amount, the reactive values of the driver and load side reactances are decreased in unison. The reactances are always adjusted so that for each unit change of the reactive value on the driver side there is a considerably greater change in the reactive value on the load side.

While there have been described and illustrated several specific embodiments of the invention, it will be clear that variations in details of the embodiments specifically illustrated and described may be made without departing from the true spirit and scope of the invention as defined in the appended claims. For example, the invention is applicable to situations wherein an antenna is an excitation source for driving a receiver. However, in this case, a source of rf power is required to initially provide tune control signals for adjusting the matching network.

What is claimed is:

1. A method of matching a load circuit to a drive circuit with a matching network connected between the circuits, one of said circuits being of a first reactive type, said network including: an L network having a series arm and a shunt arm, one of said arms being on a side of the L network connected to the other of said circuits, the other of said arms being on a side of the network connected to said one circuit, said other arm including a reactance of a second reactive type, opposite to the first reactive type, said one arm including a further reactance having a value to provide an approximate match between the circuits, comprising measuring the amplitude of first and second parameters respectively indicative of the energy in said one arm and the energy in the other arm and the one circuit, the two measured parameters being of the same type, and adjusting the value of the reactance in the other arm until the second measured parameter is slightly greater, by a predetermined amount, than the first measured parameter.

2. The method of claim 1 wherein the measured energy indicating parameters are the voltages across (a) terminals of the reactance in the one arm and (b) terminals of the reactance in the other arm and the one circuit.

3. The method of claim 1 wherein the measured indicating parameters are the currents flowing (a) in the one arm and (b) in the other arm and the one circuit.

4. A method of matching a load circuit to drive circuit with a matching network connected between the circuits, one of said circuits being of a first reactive type, said network including: an L network having a series arm and a shunt arm, one of said arms being on a side of the L network connected to the other of said circuits, the other of said arms being on a side of the network connected to said one circuit, said other arm including a reactance of a second reactive type, opposite to the first reactive type, said one arm including a further reactance having a value to provide an approximate match between the circuits, comprising measuring the amplitude of a first parameter indicative of the energy in said one arm, measuring the amplitude of a second parameter indicative of the energy in the other arm and the one circuit, measuring the amplitude of a third parameter indicative of the energy in the other circuit, the three measured parameters being of the same type, adjusting the value of the reactance in the other arm until the first measured parameter is at least the same magnitude as the third measured parameter, and then adjusting the value of the reactance in the other arm until the second measured parameter is slightly greater by a predetermined amount, than the first measured parameter.

5. The method of claim 4 wherein the first, second and third measured energy indicating parameters are respectively the voltages across: (a) terminals of the reactance in the one arm, (b) terminals of the reactance in the other arm and the one circuit, and (c) output terminals of the other circuit.

6. The method of claim 4 wherein the first, second and third measured energy indicating parameters are currents flowing: (a) in the one arm, (b) in the other arm and the one circuit, and (c) in the other circuit.

7. A method of matching a load circuit to a drive circuit with a matching network connected between the circuits, one of said circuits being of a first reactive type, said network including: and L network having a series arm and a shunt arm, one of said arms being on a side of the L network connected to the other of said circuits, the other of said arms being on a side of the network connected to said one circuit, said other arm including a reactance of a second reactive type, opposite to the first reactive type, comprising measuring the amplitude of a first parameter indicative of the energy in said one arm, measuring the amplitude of a second parameter indicative of the energy in the other arm and the one circuit, measuring the amplitude of a third parameter indicative of the energy in the other circuit, the three measured parameters being of the same type, adjusting the values of the reactances in both arms in unison until the first measured parameter is at least the same magnitude as the third measured parameter, and then adjusting the values of the reactances in both arms in unison until the second measured parameter is slightly greater by a predetermined amount than the first measured parameter, in both of said adjusting steps, the value of the reactance of the other arm being adjusted so that for each unit change thereof there is a much smaller change in the value of the reactance of the arm.

8. The method of claim 7 wherein the first, second and third measured energy indicating parameters are respectively voltages across (a) terminals of the reactance in the one arm, (b) terminals of the reactance in the other arm and the one circuit, and (c) output terminals of the other circuit.

9. The method of claim 7 wherein the first, second and third measured energy indicating parameters are currents flowing (a) in the one arm, (b) in the other arm and the one circuit, and (c) in the other circuit.

10. Apparatus for matching a load circuit to a drive circuit, one of said circuits being of a first reactive type, comprising a matching network connected between the circuits, said network including: an L network having a series arm and a shunt arm, one of said arms being on a side of the L network connected to the other of said circuits, the other of said arms being on a side of the network connected to said one circuit, said other arm including a reactance of a second reactive type, opposite to the first reactive type, said one arm including a further reactance having a value to provide an approximate match between the circuits; means for measuring the amplitude of first and second parameters respectively indicative of: (a) the energy in said one arm, and (b) the energy in said other arm and the one circuit, the two measured parameters being of the same type; and means responsive to the measuring means for adjusting the value of the reactance in the other arm.

11. The apparatus of claim 10 wherein the means for adjusting includes means for varying the reactance in the other arm until the second measured parameter is slightly greater, by a predetermined amount, than the first measured parameter.

12. The apparatus of claim 10 wherein the means for measuring the first and second parameters respectively include current measuring means responsive to currents flowing (a) in the one arm, and (b) in the other arm and the one circuit, said one arm being the shunt arm, the other arm being the series arm, the shunt arm being connected across terminals of the other circuit, the series arm being connected between a terminal of the other circuit and a terminal of the one circuit.

13. The apparatus of claim 10 wherein the means for measuring the first and second parameters respectively include voltage measuring means responsive to the voltages across (a) terminals of the reactance in the one arm, and (b) terminals of the reactance in the other arm and the one circuit, said one arm being the series arm, the other arm being the shunt arm, said series arm being connected between a terminal of the other circuit and a terminal of the one circuit, said shunt arm being connected across terminals of the one circuit.

14. Apparatus for matching a load circuit to a drive circuit, one of said circuits being of a first reactive type, comprising a matching network connected between the circuits, said network including: an L network having a series arm and a shunt arm, one of said arms being on a side of the L network connected to said other circuit, the other of said arms being on a side of the network connected to said one circuit, said other arm including a reactance of a second reactive type, opposite to the first reactive type, said one arm including a further reactance having a value to provide an approximate match between the circuits; means for measuring the amplitude of first, second and third parameters respectively indicative of: (a) the energy in said one arm, (b) the energy in the other arm and the one circuit, and (c) the energy in the other circuit, the three measured parameters being of the same type; and means responsive to the measuring means for adjusting the value of the reactance in the other arm.

15. The apparatus of claim 14 wherein the means for adjusting includes means for adjusting the value of the reactance in the other arm until the first measured parameter has at least the same magnitude as the third measured parameter, and adjusting the value of the reactance in the other arm until the second measured parameter is slightly greater, by a predetermined amount, than the first measured parameter.

16. The apparatus of claim 15 wherein the means for measuring the first, second and third parameters respectively include current measuring means responsive to currents flowing (a) in the one arm, (b) in the other arm and the one circuit, and (c) in the other circuit, said one arm being the shunt arm, the other arm being the series arm, the shunt arm being connected across terminals of the other circuit, the series arm being connected between a terminal of the other circuit and a terminal of the one circuit.

17. The apparatus of claim 15 wherein the means for measuring the first, second and third parameters respectively include voltage measuring means responsive to the voltages across (a) terminals of the reactance in the one arm, (b) terminals of the reactance in the other arm and the one circuit, and (c) terminals in the other circuit, said one arm being the series arm, the other arm being the shunt arm, said series arm being connected between a terminal of the other circuit and a terminal of the one circuit, said shunt arm being connected across terminals of the one circuit.

18. Apparatus for matching a load circuit to a drive circuit, one of said circuits being of a first reactive type, comprising a matching network connected between the circuits, said network including: an L network havig a series arm and a shunt arm, one of said arms being on a side of the L network connected to the other of said circuits, the other of said arms being on a side of the network connected to said one circuit, said other arm including a reactance of a second reactive type, opposite to the first reactive type, means for measuring the amplitude of first, second and third parameters respectively indicative of (a) the energy in said one arm, (b) the energy in the other arm and the one circuit, and (c) the energy in the other circuit, the three measured parameters being of the same type; and means responsive to the measuring means for adjusting the values of the reactances in both arms in unison, the value of the reactance of the other arm being adjusted so that for each unit change thereof there is a much smaller change in value of the reactance of the one arm.

19. The apparatus of claim 18 wherein the means for measuring the first, second and third parameters respectively include current measuring means responsive to currents flowing (a) in the one arm, (b) in the other arm and the one circuit, and (c) in the other circuit, said one arm being the shunt arm, the other arm being the series arm, the shunt arm being connected across terminals of the other circuit, the series arm being connected between a terminal of the other circuit and a terminal of the one circuit.

20. The apparatus of claim 18 wherein the means for adjusting includes means for adjusting the reactances of the one and other arms until the first measured parameter has at least the same magnitude as the third measured parameter, and adjusting the value of the reactance in the other arm until the second measured parameter is slightly greater, by a predetermined amount, than the first measured parameter.

21. The apparatus of claim 18 wherein the means for measuring the first, second and third parameters respectively include voltage measuring means responsive to the voltages across (a) terminals of the reactance in the one arm, (b) terminals of the reactance in the other arm and the one circuit, and (c) terminals of the other circuit, said one arm being the series arm, the other arm being the shunt arm, said series arm being connected between a terminal of the other circuit and a terminal of the one circuit, said shunt arm being connected across terminals of the one circuit.

* * * * *